United States Patent
Patel et al.

(10) Patent No.: US 11,404,254 B2
(45) Date of Patent: Aug. 2, 2022

(54) INSERTABLE TARGET HOLDER FOR SOLID DOPANT MATERIALS

(71) Applicant: Varian Semiconductor Equipment Associates, Inc., Gloucester, MA (US)

(72) Inventors: Shreyansh Patel, Gloucester, MA (US); Graham Wright, Newburyport, MA (US); Daniel Alvarado, Methuen, MA (US); Klaus Becker, Kensington, NH (US); Daniel R. Tieger, Manchester, MA (US); Stephen Krause, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 416 days.

(21) Appl. No.: 16/269,120

(22) Filed: Feb. 6, 2019

(65) Prior Publication Data

US 2020/0090916 A1 Mar. 19, 2020

Related U.S. Application Data

(60) Provisional application No. 62/733,353, filed on Sep. 19, 2018.

(51) Int. Cl.
*H01J 37/34* (2006.01)
*H01J 37/08* (2006.01)

(52) U.S. Cl.
CPC .......... *H01J 37/3435* (2013.01); *H01J 37/08* (2013.01); *H01J 37/3432* (2013.01)

(58) Field of Classification Search
CPC .. C23C 14/24; C23C 14/3428; H01J 37/3435; H01J 37/3432; H01J 37/08
See application file for complete search history.

(56) References Cited

U.S. PATENT DOCUMENTS 3,404,084 A 10/1968 Hamilton
4,061,800 A * 12/1977 Anderson ............... C23C 14/24
427/568

(Continued)

FOREIGN PATENT DOCUMENTS

CN 1946868 A 4/2007
JP 4-28862 A 1/1992

(Continued)

OTHER PUBLICATIONS

International Search Report and Written Opinion dated Dec. 30, 2020 in co-pending PCT application No. PCT/US2020/050857.

(Continued)

*Primary Examiner* — John J Brayton
(74) *Attorney, Agent, or Firm* — Nields, Lemack & Frame, LLC

(57) ABSTRACT

An ion source with an insertable target holder for holding a solid dopant material is disclosed. The insertable target holder includes a pocket or cavity into which the solid dopant material is disposed. When the solid dopant material melts, it remains contained within the pocket, thus not damaging or degrading the arc chamber. Additionally, the target holder can be moved from one or more positions where the pocket is at least partially in the arc chamber to one or more positions where the pocket is entirely outside the arc chamber. In certain embodiments, a sleeve may be used to cover at least a portion of the open top of the pocket.

12 Claims, 9 Drawing Sheets

(56) References Cited

U.S. PATENT DOCUMENTS

| | | |
|---|---|---|
| 5,089,746 A | 2/1992 | Rosenblum et al. |
| 5,180,477 A | 1/1993 | Ito |
| 5,733,418 A | 3/1998 | Hershcovitch et al. |
| 6,048,813 A | 4/2000 | Hunter |
| 6,768,121 B2 | 7/2004 | Horsky et al. |
| 7,655,932 B2 | 2/2010 | Hatem et al. |
| 7,838,850 B2 | 11/2010 | Hahto et al. |
| 8,324,592 B2 | 12/2012 | Ryding et al. |
| 8,759,788 B1 | 6/2014 | Bassom |
| 8,809,800 B2 | 8/2014 | Koo et al. |
| 9,287,079 B2 | 3/2016 | Chaney et al. |
| 9,396,902 B2 | 7/2016 | Biloiu et al. |
| 10,600,611 B2 | 3/2020 | Becker et al. |
| 10,957,509 B1 * | 3/2021 | Wright .................. H01J 37/08 |
| 11,170,967 B2 | 11/2021 | Bassom et al. |
| 2002/0130270 A1 | 9/2002 | Reyes |
| 2002/0153493 A1 | 10/2002 | Miyabayashi |
| 2006/0097645 A1 | 5/2006 | Horsky |
| 2006/0163489 A1 | 7/2006 | Low et al. |
| 2007/0281081 A1 | 12/2007 | Nakamura et al. |
| 2009/0183679 A1 | 7/2009 | McIntyre et al. |
| 2009/0289197 A1 | 11/2009 | Slocum et al. |
| 2009/0309041 A1 | 12/2009 | Kurunczi et al. |
| 2010/0148088 A1 | 6/2010 | Radovanov et al. |
| 2012/0048723 A1 * | 3/2012 | Chaney ............... H01J 37/3171 |
| | | 204/192.11 |
| 2012/0104273 A1 | 5/2012 | Ryding et al. |
| 2012/0255490 A1 | 10/2012 | Tanjo |
| 2013/0072008 A1 | 3/2013 | Perel et al. |
| 2013/0260544 A1 | 10/2013 | Koo et al. |
| 2013/0313971 A1 | 11/2013 | Biloiu et al. |
| 2014/0061033 A1 * | 3/2014 | Biskeborn ............ G11B 5/3163 |
| | | 204/192.35 |
| 2014/0238637 A1 | 8/2014 | Tanaka |
| 2014/0319369 A1 | 10/2014 | Koo et al. |
| 2015/0034837 A1 | 2/2015 | Koo et al. |
| 2017/0140898 A1 | 5/2017 | Kawaguchi |
| 2017/0247789 A1 | 8/2017 | Yarmolich |
| 2018/0005793 A1 | 1/2018 | Chaney et al. |
| 2019/0180971 A1 | 6/2019 | Becker et al. |
| 2021/0110995 A1 | 4/2021 | Patel et al. |
| 2021/0375585 A1 | 12/2021 | Patel et al. |

FOREIGN PATENT DOCUMENTS

| | | | | |
|---|---|---|---|---|
| JP | 5-54809 A | 3/1993 | | |
| JP | 5-174762 A | 7/1993 | | |
| JP | 2010111884 A | * 5/2010 | ......... | C23C 14/3428 |
| JP | 2011-525036 A | 9/2011 | | |
| JP | 2012-1764 A | 1/2012 | | |
| JP | 2012-221629 A | 11/2012 | | |
| JP | 2013-536561 A | 9/2013 | | |
| JP | 2018-59134 A | 4/2018 | | |
| KR | 10-0793366 B1 | 1/2008 | | |
| KR | 2011-0139575 A | 12/2011 | | |
| KR | 10-1209107 B1 | 12/2012 | | |
| KR | 10-1638443 B1 | 7/2016 | | |
| KR | 10-2018-0073766 A | 7/2018 | | |
| TW | 200733243 A | 9/2007 | | |
| TW | 200835398 A | 8/2008 | | |
| TW | 201225149 A | 6/2012 | | |
| TW | I413149 B | 10/2013 | | |
| TW | 201349342 A | 12/2013 | | |
| TW | I517200 B | 1/2016 | | |
| TW | I602239 B | 10/2017 | | |
| TW | 201937521 A | 9/2019 | | |
| WO | 2014/179585 A1 | 11/2004 | | |
| WO | 2006/100487 A1 | 9/2006 | | |
| WO | 2015/017635 A1 | 2/2015 | | |
| WO | 2019/118120 A1 | 6/2019 | | |

OTHER PUBLICATIONS

Notice of allowance dated Jan. 21, 2020 in co-pending U.S. Appl. No. 16/190,649.
Notice of allowance dated Dec. 16, 2020 in co-pending U.S. Appl. No. 16/676,996.
Office action dated Sep. 23, 2019 in co-pending U.S. Appl. No. 16/190,649.
International Search Report and Written Opinion dated Mar. 5, 2019 in co-pending PCT application No. PCT/US2018/061000.
International Search Report and Written Opinion dated Nov. 19, 2019 in corresponding PCT application No. PCT/US2019/045052.
International Search Report and Written Opinion dated Feb. 2, 2021 in co-pending PCT application No. PCT/US2020/056802.
Office action dated Feb. 17, 2021 in co-pending U.S. Appl. No. 16/735,125.
Notice of allowance dated Jun. 10, 2021 in co-pending U.S. Appl. No. 16/735,125.

* cited by examiner

US 11,404,254 B2

INSERTABLE TARGET HOLDER FOR SOLID DOPANT MATERIALS

This application claims priority to U.S. Provisional Patent Application Ser. No. 62/733,353, filed Sep. 19, 2018, the disclosure of which is incorporated herein by reference in its entirety.

FIELD

Embodiments of the present disclosure relate to an ion source, and more particularly, an ion source with an insertable target holder to hold solid dopant materials.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, proximate the center of the arc chamber, through which the ions created in the arc chamber may be extracted.

In certain embodiments, it may be desirable to utilize a material that is in solid form as a dopant species. However, there are issues associated with using solid dopant materials with IHC ion sources. For example, in the high-temperature environment of an IHC ion source, metal sputter targets are prone to melting, dripping, and generally degrading and destroying the arc chamber as liquid metal runs and pools in the arc chamber. As a result, ceramics that contain the dopant of interest are commonly used as the solid dopant material, because they have higher melt temperatures. However, these ceramic materials typically generate less beam current of the dopant of interest. If the metal sputter target could maintain its shape without dripping or deformation upon melting, significant increases in dopant beam current could be realized.

Therefore, an ion source that may be used with solid dopant materials having low melting temperatures, such as certain metals, would be beneficial. Further, it would be advantageous if the ion source was not contaminated by the solid dopant material. Additionally, it would be advantageous if the arc chamber could be utilized without the solid material for other processes.

SUMMARY

An ion source with an insertable target holder for holding a solid dopant material is disclosed. The insertable target holder includes a pocket or cavity into which the solid dopant material is disposed. When the solid dopant material melts, it remains contained within the pocket, thus not damaging or degrading the arc chamber. Additionally, the target holder can be moved from one or more positions where the pocket is at least partially in the arc chamber to one or more positions where the pocket is entirely outside the arc chamber. In certain embodiments, a sleeve may be used to cover at least a portion of the open top of the pocket.

According to one embodiment, an indirectly heated cathode ion source is disclosed. The indirectly heated cathode ion source comprises an arc chamber, comprising a plurality of walls connecting a first end and a second end; an indirectly heated cathode disposed on the first end of the arc chamber; and a target holder, having a pocket to hold a dopant material, wherein the target holder is oriented in the arc chamber so that gravity retains the dopant material in the target holder, the target holder entering the arc chamber through one of the plurality of walls, having a first position where the pocket is outside the arc chamber and a second position where at least a portion of the pocket is disposed in the arc chamber. In certain embodiments, the ion source comprises an actuator in communication with the target holder to move the target holder from the first position to the second position. In some embodiments, the pocket comprises a bottom surface, a plurality of sidewalls and an open top. In certain further embodiments, a sleeve is disposed over the target holder to cover at least a portion of the open top. In certain further embodiments, a sleeve surrounds a portion of the target holder to cover at least a portion of the open top. In some embodiments, the target holder comprises an enclosed pocket. In some further embodiments, the target holder comprises a conduit from the enclosed pocket to an exterior of the target holder. In certain further embodiments, the target holder is made of a porous material. In certain further embodiments, the target holder comprises a removable seal to allow access to the enclosed pocket. In some embodiments, the target holder comprises a heating element. In certain embodiments, the target holder is electrically biased with respect to the arc chamber.

According to another embodiment, an indirectly heated cathode ion source is disclosed. The indirectly heated cathode ion source comprises an arc chamber, comprising a plurality walls connecting a first end and a second end; an indirectly heated cathode disposed on the first end of the arc chamber; and a target holder, having a pocket to hold a dopant material, the target holder disposed at the second end, having a first position where at least a portion of the pocket is disposed in the arc chamber and a second position where the pocket is disposed outside the arc chamber. In certain embodiments, when the target holder is in the second position, a top surface of the target holder serves as the second end of the arc chamber. In some embodiments, the ion source comprises an actuator in communication with the target holder to move the target holder from the first position to the second position. In certain embodiments, the pocket comprises a bottom surface, a plurality of sidewalls and an open top.

According to another embodiment, an indirectly heated cathode ion source is disclosed. The indirectly heated cathode ion source comprises a housing; an arc chamber, comprising a plurality of walls connecting a first end and a second end; an indirectly heated cathode disposed on the first end of the arc chamber; a target holder, having a pocket to hold a dopant material, the target holder entering the arc chamber; and an actuator in communication with the housing and with the target holder, wherein the target holder has a first position where at least a portion of the pocket is disposed in the arc chamber and a second position where the pocket is disposed outside the arc chamber. In certain embodiments, the target holder enters the arc chamber through one of the plurality of walls. In certain embodiments, the target holder is disposed at the second end. In some embodiments, the ion source comprises a third position, where the pocket is disposed outside the arc chamber and the target holder is in thermal communication with the arc chamber such that the dopant material vaporizes while the target holder is in the third position.

According to another embodiment, a method of ionized different dopants using the indirectly heated cathode ion source described above, is disclosed. The method comprises disposing a dopant in solid form into the pocket of the target holder; introducing and ionizing a gas to create a plasma; actuating the actuator so that the pocket is disposed in the arc chamber; extracting ions containing the dopant from the indirectly heated cathode ion source; retracting the actuator so that the pocket is disposed outside the arc chamber; introducing and ionizing a second gas containing a second dopant in the arc chamber; and extracting ions containing the second dopant from the indirectly heated cathode ion source.

BRIEF DESCRIPTION OF THE FIGURES

For a better understanding of the present disclosure, reference is made to the accompanying drawings, which are incorporated herein by reference and in which.

DETAILED DESCRIPTION

As noted above, solid dopant materials with low melting points tend to turn to liquid, drip, and degrade the arc chamber as liquid runs and pools in the arc chamber.

Figure 1A:
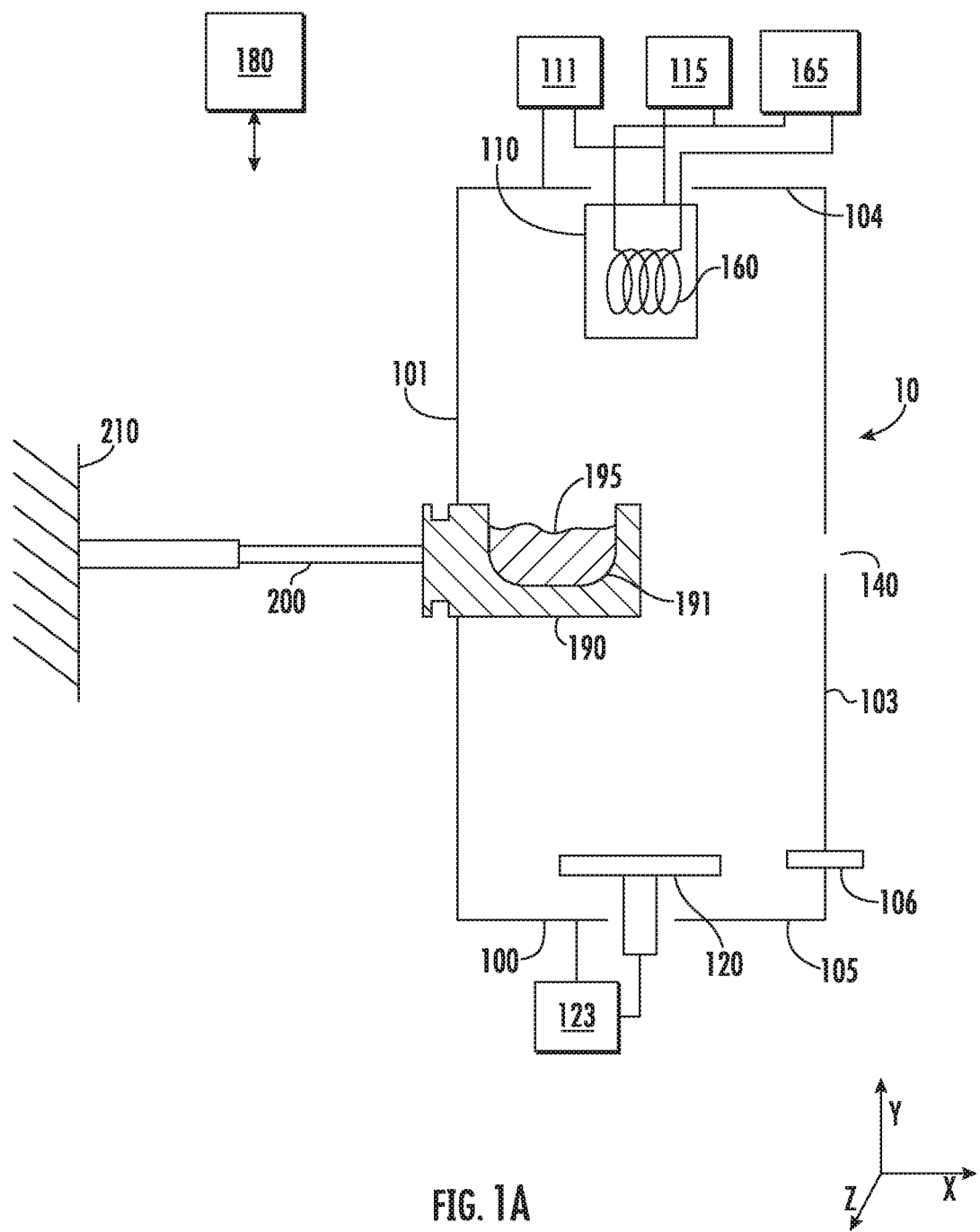
FIG. 1A is an indirectly heated cathode (IHC) ion source with an insertable target holder in accordance with one embodiment.

FIG. 1A shows an IHC ion source 10 with a target holder that overcomes these issues. The IHC ion source 10 includes an arc chamber 100, comprising two opposite ends, and walls 101 connecting to these ends. The walls 101 of the arc chamber 100 may be constructed of an electrically conductive material and may be in electrical communication with one another. In some embodiments, a liner may be disposed proximate one or more of the walls 101. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. In other embodiments, the cathode 110 may be electrically connected to the arc chamber 100, so as to be at the same voltage as the walls 101 of the arc chamber 100. In these embodiments, bias power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In still other embodiments, a repeller 120 is not employed.

The cathode 110 and the repeller 120 are each made of an electrically conductive material, such as a metal or graphite.

In certain embodiments, a magnetic field is generated in the arc chamber 100. This magnetic field is intended to confine the electrons along one direction. The magnetic field typically runs parallel to the walls 101 from the first end 104 to the second end 105. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

Disposed on one side of the arc chamber 100, referred to as the extraction plate 103, may be an extraction aperture 140. In FIG. 1A, the extraction aperture 140 is disposed on a side that is parallel to the Y-Z plane (perpendicular to the page). Further, the IHC ion source 10 also comprises a gas inlet 106 through which the gas to be ionized may be introduced to the arc chamber 100.

In certain embodiments, a first electrode and a second electrode may be disposed on respective opposite walls 101 of the arc chamber 100, such that the first electrode and the second electrode are within the arc chamber 100 on walls adjacent to the extraction plate 103. The first electrode and the second electrode may each be biased by a respective power supply. In certain embodiments, the first electrode and the second electrode may be in communication with a common power supply. However, in other embodiments, to allow maximum flexibility and ability to tune the output of the IHC ion source 10, the first electrode may be in communication with a first electrode power supply and the second electrode may be in communication with a second electrode power supply.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

The IHC ion source 10 also includes a target holder 190, which can be inserted into and retracted from the arc chamber 100. In the embodiment of FIG. 1A, the target holder 190 enters the arc chamber along one of the walls 101 of the arc chamber 100. In certain embodiments, the target holder 190 may enter the arc chamber 100 at the midplane between the first end 104 and the second end 105. In another embodiment, the target holder 190 may enter the arc chamber 100 at a location different from the midplane. In the embodiment shown in FIG. 1A, the target holder 190 enters the arc chamber 100 through the side opposite the extraction aperture 140. However, in other embodiments, the target holder 190 may enter through the sides that are adjacent to the extraction plate 103.

The target holder 190 has a cavity or pocket 191 into which the dopant material 195 may be disposed. The pocket 191 may have a bottom surface and sidewalls extending upward from the bottom surface. In certain embodiments, the sidewalls may be vertical. In other embodiments, the sidewalls may be slanted outward from the bottom surface. In some embodiments, the sidewalls and the bottom surface meet at a rounded edge. The bottom surface and the sidewalls form a cavity which is closed at the bottom. In other words, much like a traditional cup, the dopant material 195 is inserted or removed via the open top, while the sidewalls and bottom surface form a sealed structure from which the dopant material 195 cannot exit. In another embodiment, the pocket 191 may not include a bottom surface. Rather, the sidewalls may taper together and meet at a point at the bottom. In yet another embodiment, the pocket 191 may be semi-spherical.

A dopant material 195, such as indium, aluminum, antimony or gallium, may be disposed within the pocket 191 of the target holder 190. The dopant material 195 may be in the form of a solid when placed in the pocket 191. This may be in the form of a block of material, filings, shavings, balls, or other shapes. In certain embodiments, the dopant material 195 may melt and become a liquid. Therefore, in certain embodiments, the target holder 190 is configured to enter the arc chamber 100 such that the open end is facing upward and the sealed bottom is facing downward so that melted dopant material 195 cannot flow from the target holder 190 into the arc chamber 100, but rather remains in the target holder 190. In other words, the IHC ion source 10 and the target holder 190 are oriented such that the dopant material 195 is retained within the pocket 191 by gravity.

During operation, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons collide with the molecules of gas that are fed into the arc chamber 100 through the gas inlet 106. A carrier gas, such as argon, or an etching gas, such as fluorine, may be introduced into the arc chamber 100 through a suitably located gas inlet 106. The combination of electrons from the cathode 110, the gas and the positive potential creates a plasma. In certain embodiments, the electrons and positive ions may be somewhat confined by a magnetic field. In certain embodiments, the plasma is confined near the center of the arc chamber 100, proximate the extraction aperture 140. Chemical etching or sputtering by the plasma transforms the dopant material 195 into the gas phase and causes ionization. The ionized feed material can then be extracted through the extraction aperture 140 and used to prepare an ion beam.

Negative ions and neutral atoms that are sputtered or otherwise released from the dopant material 195 are attracted toward the plasma, since the plasma is maintained at a more positive voltage than the target holder 190.

In certain embodiments, the dopant material 195 is heated and vaporized due to the heat created by the plasma. However, in other embodiments, the dopant material 195 may be heated by additional means as well. For example, a heating element may be disposed within the target holder 190 to further heat the dopant material 195. The heating element may be a resistive heating element, or some other type of heater.

In certain embodiments, the target holder 190 may be made of a conductive material and may be grounded. In a different embodiment, the target holder 190 may be made of a conductive material and may be electrically floated. In a different embodiment, the target holder 190 may be made of a conductive material and may be maintained at the same voltage as the walls 101. In other embodiments, the target holder 190 may be made of an insulating material.

In yet another embodiment, the target holder 190 may be biased electrically with respect to the arc chamber 100. For example, the target holder 190 may be made from a conductive material and may be biased by an independent power supply (not shown) so as to be at a different voltage than the walls 101. This voltage may be more positive or more negative than the voltage applied to the walls 101. In this way, electrical biasing may be used to sputter the dopant material 195.

The target holder 190 is in communication with one end of an actuator 200. The opposite end of the actuator 200 may be in communication with a support 210. In certain embodiments, this support 210 may be the housing of the IHC ion source 10. In certain embodiments, the actuator 200 may be able to change its total displacement. For example, the actuator 200 may be a telescoping design.

FIG. 1A shows an IHC ion source 10 where the cathode 110 is disposed on the first end 104 of the arc chamber 100 that faces the open end of the pocket 191. However, other embodiments are also possible.

Figure 1B:
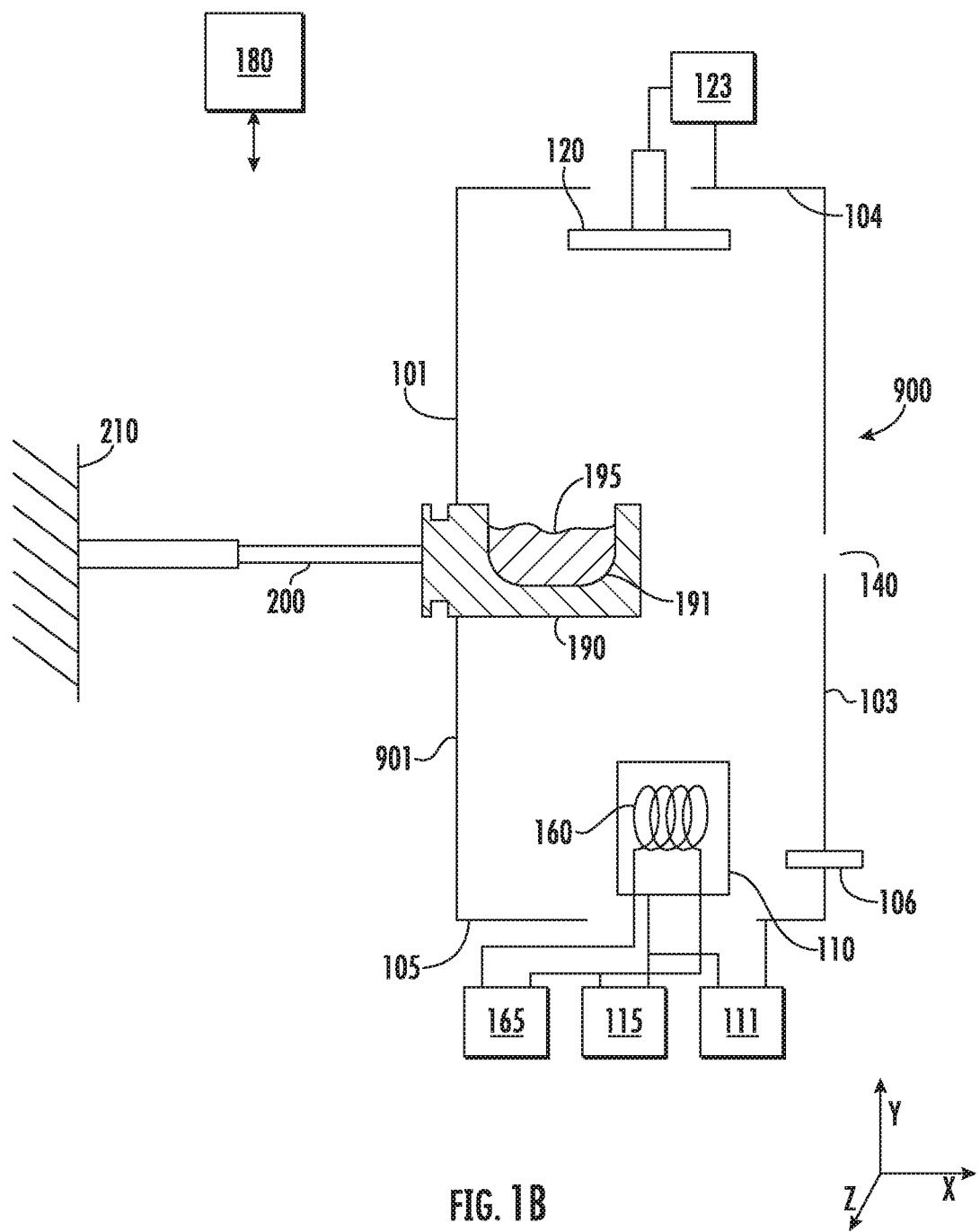
FIG. 1B is an indirectly heated cathode (IHC) ion source with an insertable target holder in accordance with one embodiment.

FIG. 1B shows an ion source 900 where the cathode 110 is disposed on the second end 105 of the arc chamber 901. Components that have the same function as those shown in FIG. 1A have been given identical reference designators. This second end 105 is the end that faces the sealed bottom of the pocket 191.

The embodiment of FIG. 1B may reduce the operating temperature of the dopant material 195 in the pocket 191. In some embodiments, the portion of the pocket 191 that is directly exposed to the cathode 110 may be at a higher temperature that the portion of the pocket 191 that is exposed to the repeller 120. By interchanging the positions of the cathode 110 and the repeller 120 relative to the pocket 191, the open end of the pocket 191 now faces the repeller 120, which may be at a lower temperature than the cathode 110. In certain embodiments, reducing the operating temperature of the dopant material 195 may reduce the rate of evaporation of the dopant material 195 into the arc chamber, which may result in a reduction in the consumption rate of the dopant material 195. This may increase the time between subsequent refills of the dopant material 195 in the pocket 191.

Figure 2:
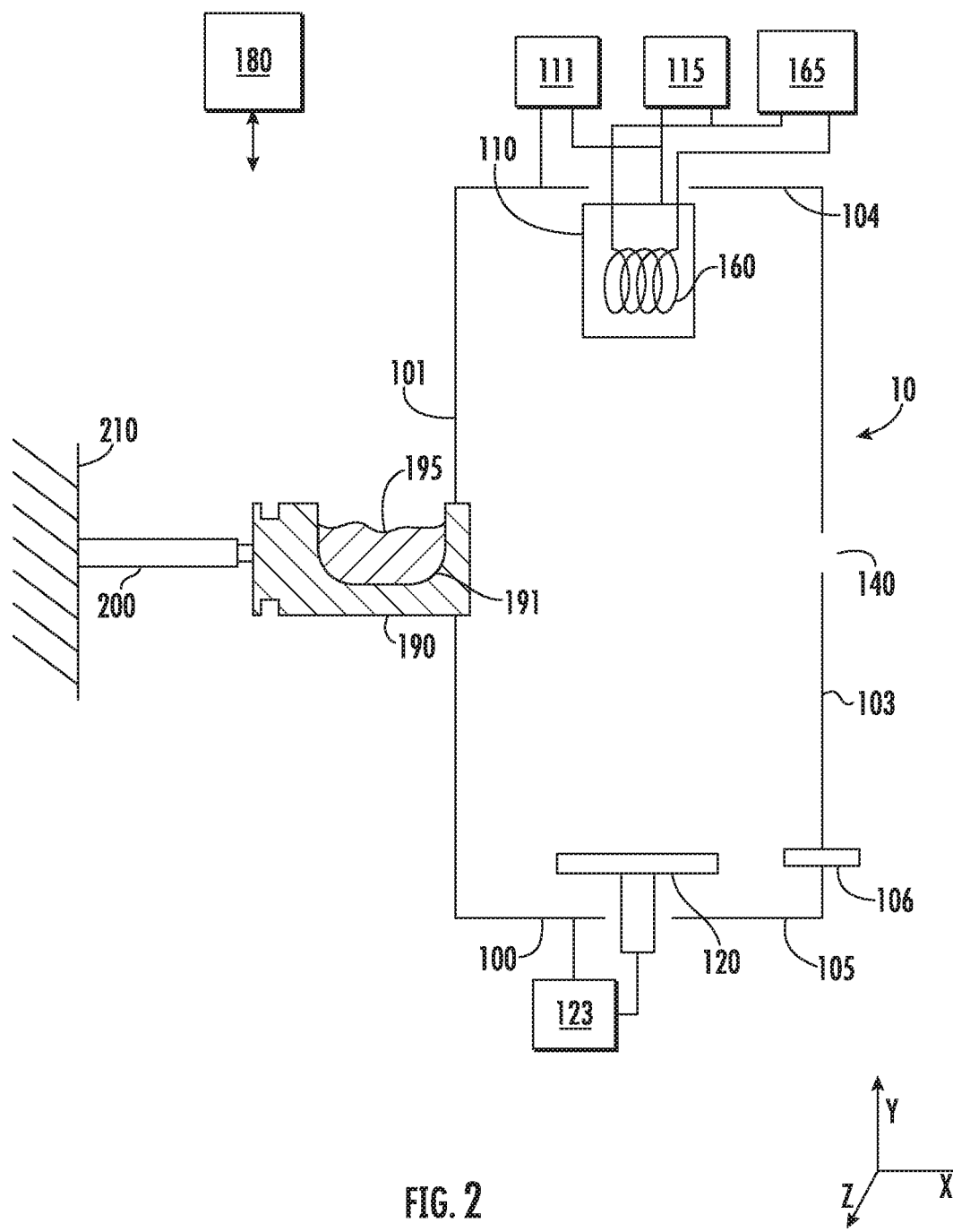
FIG. 2 is the IHC ion source of FIG. 1A with the insertable target holder retracted.

FIG. 2 shows the IHC ion source 10 of FIG. 1A with the actuator 200 in the retracted position. In this position, the pocket 191 is completely outside the arc chamber 100. In certain embodiments, the dopant material 195 cools when the pocket 191 is outside the arc chamber 100. In this way, none of the dopant material 195 enters the arc chamber when the actuator 200 is in the retracted position.

While FIGS. 1A and 1B show the pocket 191 completely within the arc chamber 100 and FIG. 2 shows the pocket 191 completely outside the arc chamber 100, other positions may be possible. By controlling the distance that the target holder 190 is inserted into the arc chamber 100, the temperature of the target holder 190 and the dopant material 195 may be controlled. Further, controlling the distance that the target holder 190 is inserted into the arc chamber 100 also determines the surface area of the dopant material 195 that is exposed to the arc chamber 100 and is etched.

These factors may determine the amount of dopant beam current that is achieved from the dopant material 195. Further, if the target holder 190 is fully retracted, the dopant beam current may go to zero. This allows other dopant species to be used in the IHC ion source 10 without the risk of any cross-contamination. In other words, when the actuator 200 is retracted, a different dopant species may be introduced through the gas inlet 106 and ionized, without contamination from the dopant material 195 disposed in the pocket 191.

In certain embodiments, it may be possible to have the target holder 190 not inserted into the arc chamber 100, but positioned close enough so that the dopant material 195 is heated and the vapor enters the arc chamber 100. For example, the target holder 190 may be made of a material with high thermal conductivity. In this way, if the target holder 190 is close to the arc chamber 100, the heat from the plasma is transferred to the dopant material 195 and the vaporized dopant material may enter the arc chamber 100, even when the target holder 190 is retracted, as shown in FIG. 2.

In this embodiment, there may be a first retracted position where the target holder 190 is still in thermal communication with the arc chamber 100 and the dopant material 195 is vaporized. There may also be a second retracted position where the target holder 190 is moved further from the arc chamber 100 so that the dopant material 195 is not vaporized. In this second retracted position, a different dopant may be introduced into the arc chamber without risk of cross-contamination.

In other words, in certain embodiments, the target holder 190 may be disposed in at least three different positions; a first position where at least a portion of the pocket 191 is disposed within the arc chamber 100; a second position where the pocket 191 is disposed outside the arc chamber 100; and a third position where the pocket 191 is disposed outside the arc chamber 100, but is still in thermal communication with the arc chamber 100 such that the dopant material 195 vaporizes.

Figure 3A:
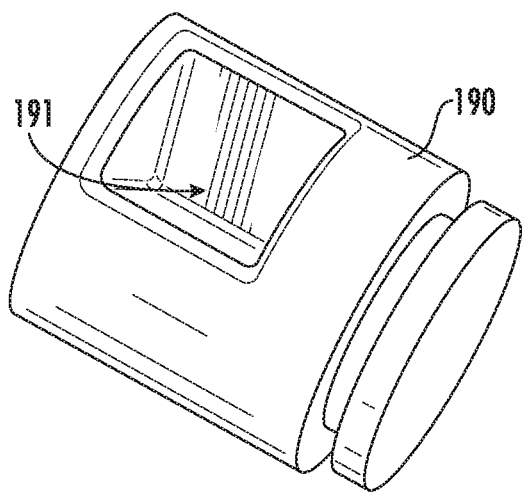
FIGS. 3A-3C show three views of the insertable target holder of FIGS. 1A-1B.
Figure 3B:
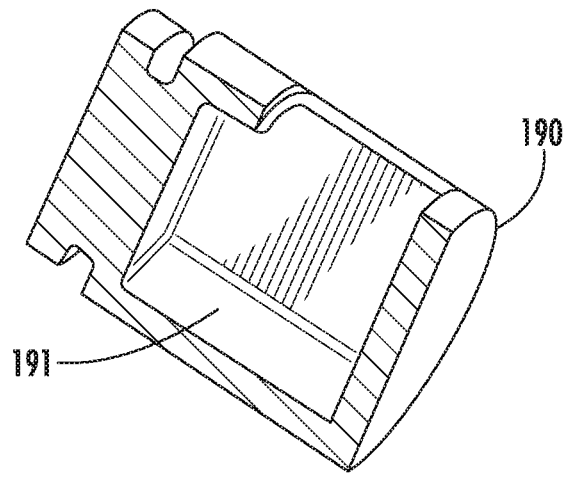
Figure 3C:
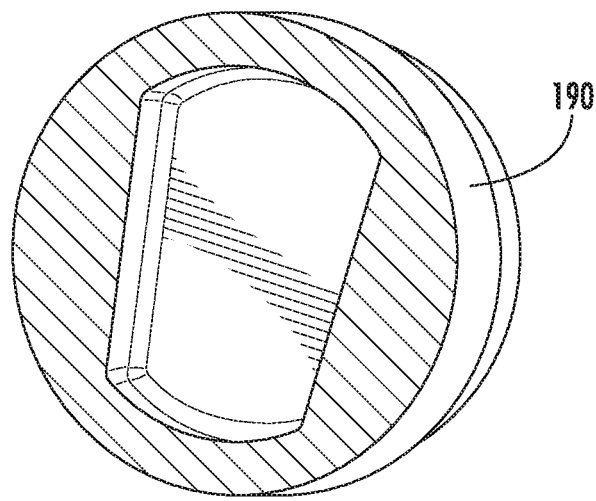

FIGS. 3A-3C show the target holder 190 in greater detail. FIG. 3A shows a perspective view of the target holder 190. FIG. 3B shows a cross-sectional view taken along a plane parallel to the X-Y plane. FIG. 3C shows a cross-sectional view taken along a plane parallel to the Y-Z plane.

The material for the target holder 190 is selected to be able to withstand the high temperatures within the arc chamber 100. Further, the material may be compatible with liquids. The material may also be at least as resistant to etching and sputtering as the dopant material 195. Some materials that possess these characteristics include refractory metals, such as tungsten, tantalum and molybdenum, as well as ceramics, such as alumina, and graphite.

Additionally, in certain embodiments, the dopant material 195 may have a greater coefficient of thermal expansion than the target holder 190. Thus, before the dopant material 195 melts, it may expand in volume, exerting mechanical stress on the sidewalls of the pocket 191, and possibly causing cracking or breaking of the target holder 190. Thus, in certain embodiments, the sidewalls of the target holder 190 are designed to minimize stress from thermal expansion and to remove any high stress inflection points, such as sharp corners or edges. The draft angles of the sidewalls can also be modified and optimized to direct the thermal stress induced through expansion. Draft angles are best seen in FIG. 3C.

Figure 4:
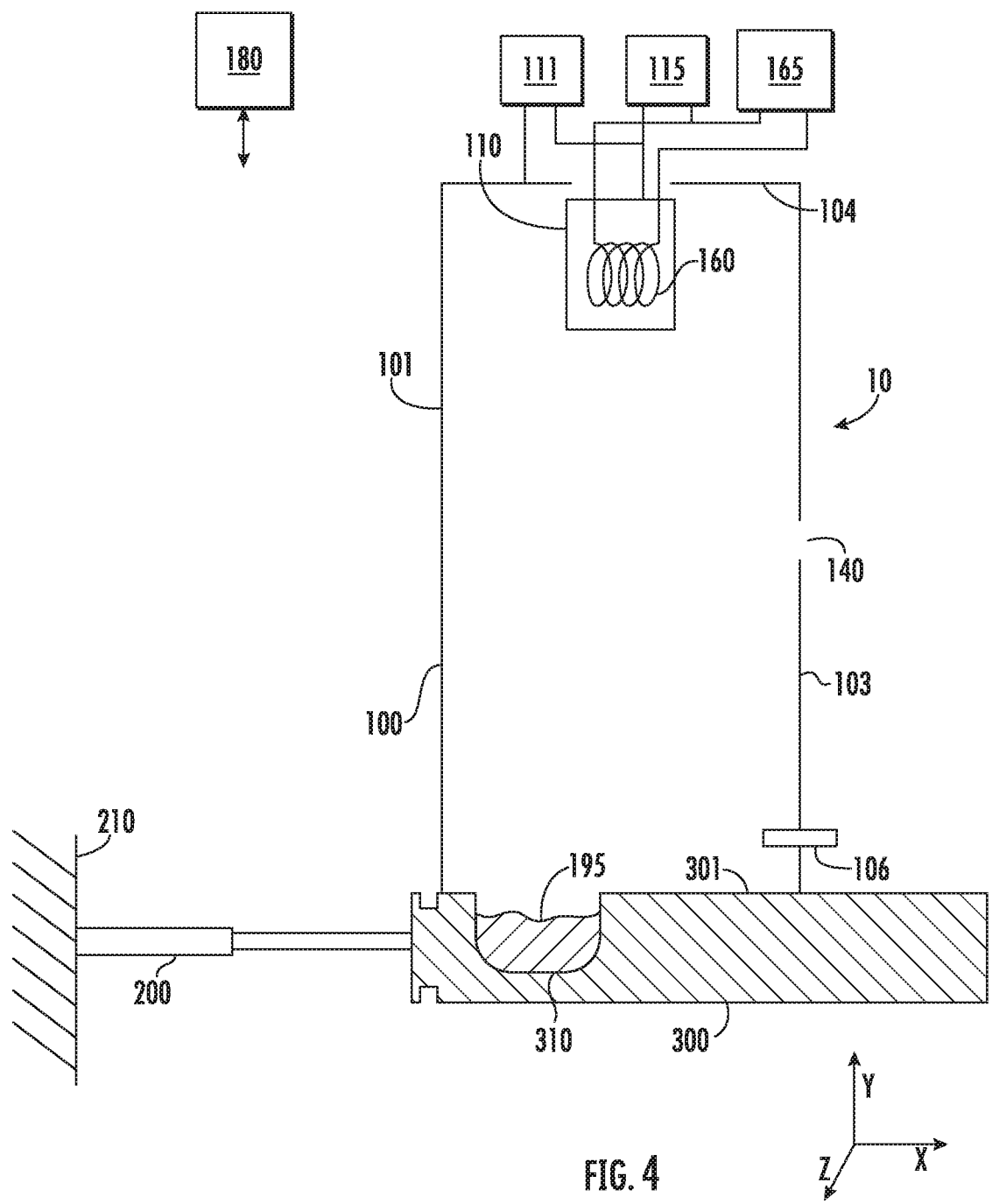
FIG. 4 is an indirectly heated cathode (IHC) ion source with an insertable target holder in accordance with another embodiment.

FIG. 4 shows another embodiment where the target holder serves as the second end of the arc chamber 100. Components that have the same function as those shown in FIG. 1A have been given identical reference designators.

In this embodiment, the target holder 300 has a cavity or pocket 310 in which the dopant material 195 may be disposed. In this embodiment, the target holder 300 is in communication with one end of an actuator 200. The opposite end of the actuator 200 may be in communication with a support 210, such as the housing of the IHC ion source 10.

Figure 5:
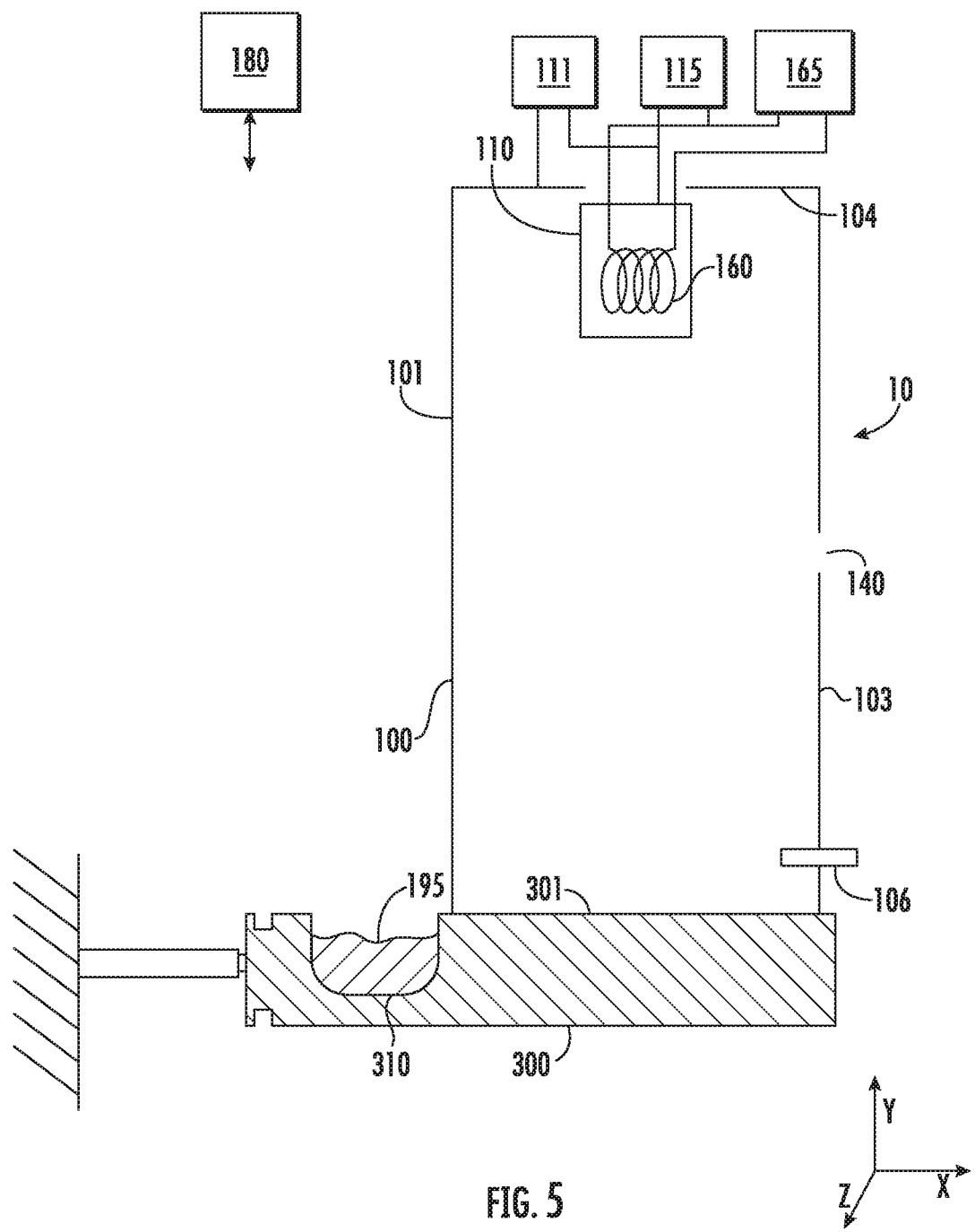
FIG. 5 is the IHC ion source of FIG. 4 with the insertable target holder retracted.

FIG. 5 shows the embodiment of FIG. 4 where the actuator 200 is retracted. In this configuration, the top surface 301 of the target holder 300 becomes the second end of the arc chamber 100. The pocket 310 is outside the arc chamber 100 in the retracted position. This allows operation of other species without exposure of the solid dopant material 195.

The embodiment of FIGS. 4-5 may also allow more flexibility to the size and structure of the target holder 300 itself. This embodiment may also allow more flexibility for the configuration of the arc chamber 100. This embodiment may also provide more direct interaction between the dopant material 195 and the plasma.

Figure 6A:
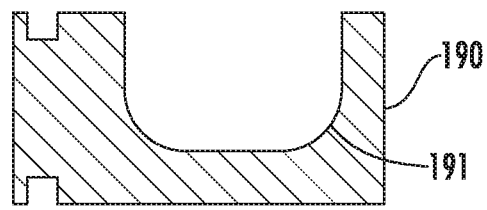
FIGS. 6A-6D show various target holders that may be used with any of the embodiments.

While FIGS. 1-2 and 4-5 show a target holder 190 having a particularly shaped pocket 191. However, the disclosure is not limited to this configuration. FIG. 6A shows the target holder 190 that was used in FIGS. 1-2 and 4-5.

Figure 6B:
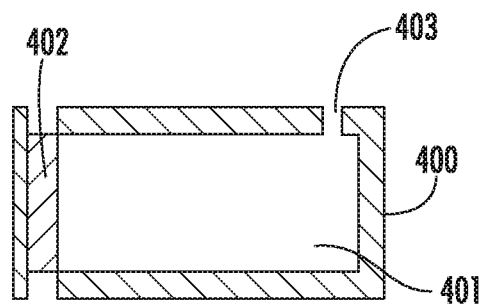

FIG. 6B shows a target holder 400 that has an enclosed pocket 401. The target holder 400 has a conduit 403 on its top surface that connects the outside environment to the enclosed pocket 401. A removable seal 402 forms one surface of the enclosed pocket 401. To introduce dopant material into the enclosed pocket 401, the removable seal 402 is removed. The dopant material is then introduced into the enclosed pocket 401. The removable seal 402 is then replaced. The target holder 400 is introduced into the arc chamber 100 so that the conduit 403 is at or near the top surface. In this embodiment, the dopant material melts inside the enclosed pocket 401. As the temperature increases, the dopant material may vaporize or sublimate. This may allow an inert gas, such as argon, to be used rather than the fluorinated gasses that are typically used to etch these solid target materials. Being able to run an argon plasma rather than a fluorinated plasma may result in much greater source life and stability.

Figure 6C:
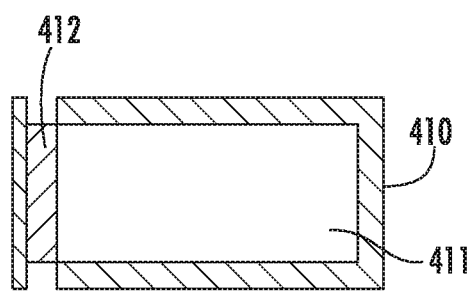

FIG. 6C shows a target holder 410 having an enclosed pocket 411. Unlike the embodiment of FIG. 6B, this target holder 410 has no conduits. Rather, the target holder 410 may be constructed of a porous material, such as porous tungsten. Like the embodiment of FIG. 6B, the target holder 410 has a removable seal 412 through which the dopant material may be introduced.

Figure 6D:
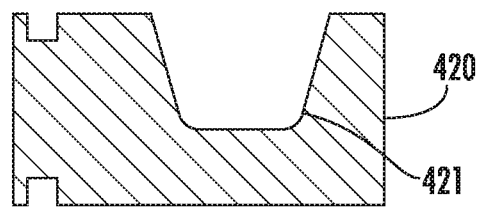

FIG. 6D shows another embodiment of a target holder 420. In this embodiment, the pocket 421 may be more conical shaped. For example, the pocket 421 may be a truncated cone shape. This shape may be helpful to accommodate the difference in the coefficient of thermal expansion of the dopant material and the target holder 420.

Because the target holder 190 is in communication with an actuator 200, it is possible to utilize the IHC ion source 10 to extract ions from a solid dopant and also to utilize the IHC ion source 10 to extract ions from a feedgas.

Figure 7:
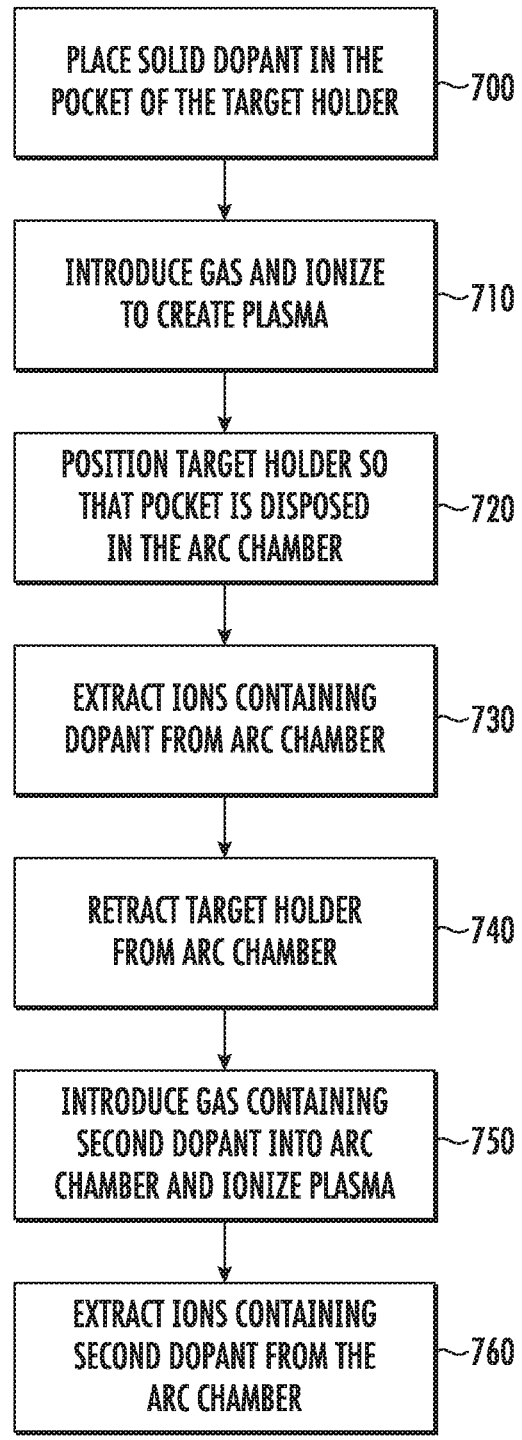
FIG. 7 shows a method of operating the IHC ion sources described herein.

FIG. 7 shows a flowchart showing the operation of the IHC ion source 10. This method can be used for the IHC ion source shown in FIGS. 1-2 or the IHC ion source shown in FIGS. 4-5. First, as shown in Process 700, a solid dopant material is placed in the pocket 191 of the target holder 190. A gas is introduced into the arc chamber 100 through the gas inlet 106 and ionized to create a plasma, as shown in Process 710. The gas used may be an inert gas, such as argon, or may be a halogen gas. The target holder 190 is then moved so that at least a portion of the pocket 191 is disposed within the arc chamber 100, as shown in Process 720. These two processes may be performed in the opposite order. The plasma causes the solid dopant to sublimate or sputter, creating ions of the dopant. These ions containing the dopant are then extracted from the arc chamber 100, as shown in Process 730.

Later, the target holder 190 is retracted from the arc chamber, as shown in Process 740, so that the pocket is disposed outside the arc chamber 100. A new gas containing a second dopant is then introduced to the arc chamber 100 and ionized into a plasma, as shown in Process 750. Because the pocket 191 is now outside the arc chamber, there is no contamination from the solid dopant. The ions containing the second dopant are then extracted from the arc chamber 100, as shown in Process 760.

Figure 8A:
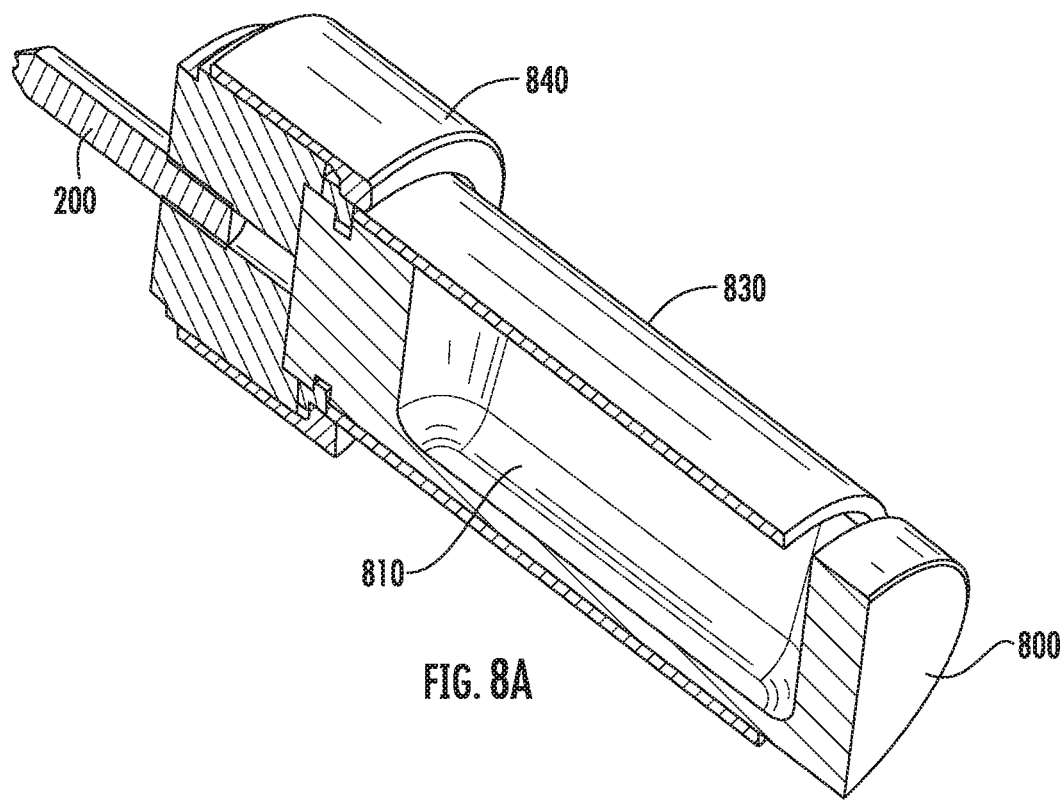
FIGS. 8A-8B show another embodiment of the insertable target holder having a sleeve.
Figure 8B:
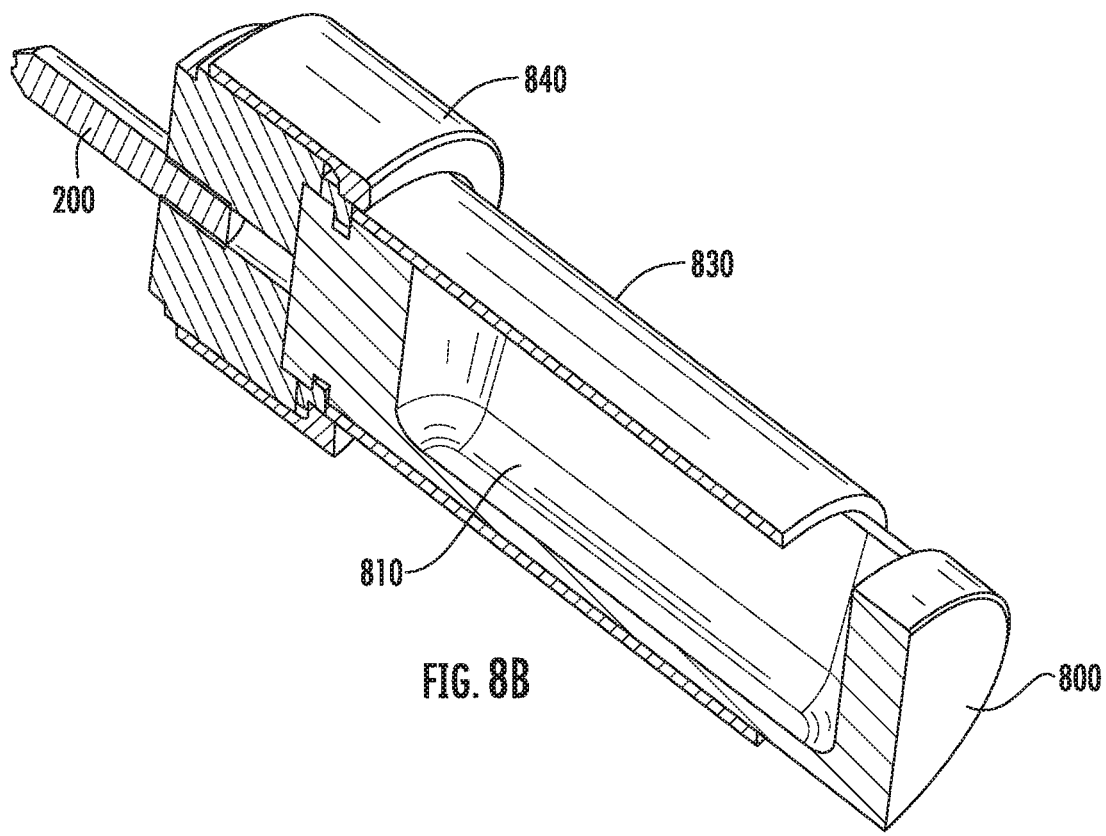

Additionally, the target holder may be configured to have a sleeve. FIGS. 8A-8B show another embodiment of the target holder 800, having a sleeve 830. Like the other embodiments, the target holder 800 may be in communication with an actuator 200. The target holder 800 may also have a pocket 810. As described above, the pocket 810 may have a bottom surface and sidewalls extending upward from the bottom surface. In certain embodiments, the sidewalls may be vertical. In other embodiments, the sidewalls may be slanted outward from the bottom surface. In some embodiments, the sidewalls and the bottom surface meet at a rounded edge. The bottom surface and the sidewalls form a cavity or pocket 810 which is closed at the bottom. In other words, much like a traditional cup, the dopant material 195 is inserted or removed via the open top, while the sidewalls and bottom surface form a sealed structure from which the dopant material 195 cannot exit. In another embodiment, the pocket 810 may not include a bottom surface. Rather, the sidewalls may taper together and meet at a point at the bottom. In yet another embodiment, the pocket 810 may be semi-spherical.

A sleeve 830 may be used to cover a portion of the pocket 810. The material for the sleeve 830 may be selected to be able to withstand the high temperatures within the arc chamber. Further, the material may be compatible with liquids. The material may also be at least as resistant to etching and sputtering as the dopant material 195. Some materials that possess these characteristics include refractory metals, such as tungsten, tantalum and molybdenum, as well as ceramics, such as alumina, and graphite.

The sleeve 830 may encircle the entirety of the target holder 800, or may only cover a portion of the target holder 800. For example, as shown in FIGS. 8A-8B, the sleeve 830 may be dimensioned so as to slide over the target holder 800. The sleeve 830 covers a portion of the pocket 810. In certain embodiments, the sleeve 830 may be configured to slide so as to cover different fractions of the pocket 810. In other embodiments, each sleeve 830 is designed to cover a specific fraction of the pocket 810. For example, in FIG. 8A, the sleeve 830 is designed to cover approximately 90% of the pocket 810. In FIG. 8B, the sleeve 830 is designed to cover about 80% of the pocket 810. Thus, in certain embodiments, the length of the sleeve 830 is varied so as to cover a predetermined fraction of the pocket 810.

In one embodiment, shown in FIGS. 8A-8B, the cross-section of the target holder 800 may be roughly circular, such that the sleeve 830 may be a hollow ring that slides over the target holder 800. Of course, the target holder 800 and sleeve 830 may have other shapes as well.

In another embodiments, the sleeve 830 may be a C-shaped part, wherein the sleeve 830 surrounds only a portion of the target holder 800. This sleeves may be configured to cover varying amounts of the pocket 810. For example, the C-shaped sleeve may be slid in an axial direction or rotated about the target holder 800. In another embodiment, the size of the sleeve may be adjusted. For example, the C-shaped sleeve may be made shorter than the pocket 810. Alternatively, the width of the C-shaped sleeve may be adjusted. Note that a C-shaped sleeve is used when the cross-section of the target holder 800 is circular. If the cross-section of the target holder 800 has a different shape, the shape of the sleeve may be adapted to conform to the target holder 800.

Further, in certain embodiments, the sleeve 830 may be held in place by clamp 840.

The sleeve 830 reduces the area of the opening from which vapors from the dopant material 195 can escape from the pocket 810 into the arc chamber. Reducing the area from which vapors escape from the pocket 810 reduces the amount of dopant material that is wasted via deposition on the walls of the arc chamber and other components in the arc chamber. This reduction in area may help reduce consumption of dopant material 195 and increase the time between subsequent refills of the dopant material 195.

The sleeve 830 can also be configured to act as a heat shield by using a thermally reflective material or modifying the outward-facing surface to be thermally reflective. In this embodiment, the sleeve 830 will reflect thermal radiation from the cathode and arc chamber and lower the temperature of the target holder 190 and dopant material 195.

This target holder 800 may be used with the IHC ion sources of FIGS. 1A-1B.

While the figures show the open top of the pocket 810 facing upward, other embodiments are possible. For example, the open top of the pocket 810 may be disposed on a surface of the target holder 800 that faces toward the side or toward the bottom of the arc chamber. This pocket 810 may also have a conduit that connects an interior of the pocket 810 with an exterior of the target holder 800. For example, such a conduit may be disposed on the end of the target holder 800 or a different side of the target holder 800. In this embodiment, the sleeve 830 may be used to cover the open top of the pocket 810, so as to retain the dopant material in the target holder 800. Vapors from the dopant material exit the pocket 810 via the conduit. Note that even though the open top is not facing upward, the target holder 800 is still oriented such that gravity retains the dopant material in the target holder.

The embodiments described above in the present application may have many advantages. Using an insertable target holder allows for pure metal dopants to be used as sputter targets in an environment that exceeds their melting temperature. Traditionally, an oxide/ceramic or other solid compound containing the dopant that has a melting temperature of greater than 1200° C. is used. The use of a dopant-containing compound rather than a pure material severely dilutes the available dopant material. For example, when using $Al_2O_3$ as an alternative to pure aluminum, the stoichiometry of the ceramic composition not only introduces impurities into the plasma, possibly introducing undesirable mass coincidences with the dopant of interest, but also leads to lower beam currents than a pure elemental target. In one experiment, beam currents of up to 4.7 mA were achieved using a pure Al sputter target, whereas a maximum beam current of less than 2 mA could be achieved using an $Al_2O_3$ target. Use of pure metals will also increase the multi charge beam currents by 50%-75% as compared to the beam currents obtained from oxides/ceramics of the same metal species. With the insertable container, access to a large volume of pure metal is available when needed and the solid target can be safely removed from the arc chamber to utilize other species.

Another advantage of a solid target dopant is that it as superior tune times over vaporizer species. The tune time is faster than a vaporizer from cold start. Additionally, the solid target dopant achieves much faster tune times when tuning from single-charge to multi-charge species.

Further, another advantage is that the solid material can be easily removed from the arc chamber. This allows the arc chamber to be used for other dopants and chemistry with no risk of cross-contamination.

Additionally, higher beam currents for various metallic dopants, such as lanthanum, indium, aluminum and gallium, can be achieved. Additionally, there are charge life advantage of using a solid sputter target rather than a vaporizer species. Additionally, for some liquid metals, if the vapor pressure is low enough, the dopant material may be sublimated directly, eliminating any need to etch the dopant. Instead, a small amount of argon may be used to initialize and stabilize the plasma in the arc chamber.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An indirectly heated cathode ion source, comprising:
an arc chamber, comprising a plurality of walls connecting a first end and a second end;
an indirectly heated cathode disposed on the first end of the arc chamber; and
a target holder, having an enclosed pocket to hold a dopant material such that the dopant material is not exposed to a plasma generated in the arc chamber, wherein the target holder is oriented in the arc chamber so that gravity retains the dopant material in the target holder, the target holder entering the arc chamber through one of the plurality of walls, having a first position where the enclosed pocket is outside the arc chamber and a second position where at least a portion of the enclosed pocket is disposed in the arc chamber such that the plasma heats the dopant material in the enclosed pocket.

2. The indirectly heated cathode ion source of claim 1, further comprising an actuator in communication with the target holder to move the target holder from the first position to the second position.

3. The indirectly heated cathode ion source of claim 1, where the target holder further comprises a conduit from the enclosed pocket to an exterior of the target holder, such that in the second position, the conduit leads from the enclosed pocket to an interior of the arc chamber.

4. The indirectly heated cathode ion source of claim 1, where the target holder is made of a porous material, such that vaporized or sublimated dopant material passes through the porous material and into the arc chamber.

5. The indirectly heated cathode ion source of claim 1, wherein the target holder comprises a removable seal to allow access to the enclosed pocket.

6. The indirectly heated cathode ion source of claim 1, wherein the target holder comprises a heating element.

7. The indirectly heated cathode ion source of claim 1, wherein the target holder is electrically biased with respect to the arc chamber.

8. An indirectly heated cathode ion source, comprising:
an arc chamber, comprising a plurality of walls connecting a first end and a second end;
an indirectly heated cathode disposed on the first end of the arc chamber; and
a target holder, having a top surface and a pocket to hold a dopant material, the target holder disposed at the second end, having a first position where at least a portion of the pocket is disposed in the arc chamber and a second position where the pocket is disposed outside the arc chamber, and wherein in the second position, the top surface of the target holder serves as the second end of the arc chamber.

9. The indirectly heated cathode ion source of claim 8, further comprising an actuator in communication with the target holder to move the target holder from the first position to the second position.

10. The indirectly heated cathode ion source of claim 8, wherein the pocket comprises a bottom surface, a plurality of sidewalls and an open top.

11. The indirectly heated cathode ion source of claim 1, further comprising a third position, where the enclosed pocket is disposed outside the arc chamber and the target holder is in thermal communication with the arc chamber such that the dopant material vaporizes while the target holder is in the third position.

12. A method of ionizing different dopants, using the indirectly heated cathode ion source of claim 2, comprising:
- disposing a dopant in solid form into the enclosed pocket of the target holder;
- introducing and ionizing a gas to create a plasma;
- actuating the actuator so that the enclosed pocket is disposed in the arc chamber;
- extracting ions containing the dopant from the indirectly heated cathode ion source;
- retracting the actuator so that the enclosed pocket is disposed outside the arc chamber;
- introducing and ionizing a second gas containing a second dopant in the arc chamber; and
- extracting ions containing the second dopant from the indirectly heated cathode ion source.

* * * * *

UNITED STATES PATENT AND TRADEMARK OFFICE
CERTIFICATE OF CORRECTION

PATENT NO. : 11,404,254 B2  
APPLICATION NO. : 16/269120  
DATED : August 2, 2022  
INVENTOR(S) : Patel et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 475 days.

Signed and Sealed this  
Eleventh Day of February, 2025

Coke Morgan Stewart  
*Acting Director of the United States Patent and Trademark Office*